United States Patent
Ahn

(12) 
(10) Patent No.: US 6,265,114 B1
(45) Date of Patent: Jul. 24, 2001

(54) METHOD OF GENERATING MASK DATA IN FABRICATING SEMICONDUCTOR DEVICES

(75) Inventor: Jae-gyung Ahn, Cheongju (KR)

(73) Assignee: Hyundai Micro Electronic Co., Ltd., Choongcheongbuk-Do (KR)

(*) Notice: Subject to any disclaimer, the term of this patent is extended or adjusted under 35 U.S.C. 154(b) by 0 days.

(21) Appl. No.: 09/397,137

(22) Filed: Sep. 16, 1999

(30) Foreign Application Priority Data

Jan. 21, 1999 (KR) .................................. 99-1802

(51) Int. Cl.$^7$ .......................................... G03F 9/00
(52) U.S. Cl. ................................................. 430/5
(58) Field of Search .................. 430/5, 30; 250/492.22, 250/492.23

(56) References Cited

U.S. PATENT DOCUMENTS 6,038,020 * 3/2000 Tsukuda ............................ 430/5

* cited by examiner

Primary Examiner—S. Rosasco
(74) Attorney, Agent, or Firm—Morgan, Lewis & Bockius LLP

(57) ABSTRACT

A method of generating data for a mask in fabricating a semiconductor device is disclosed in the present application. The method includes the steps of determining original mask data for a mask hole pattern on the mask, the hole pattern being formed in at least three rows, defining the mask hole pattern as first, second, and third hole patterns, wherein the first, second, and third hole patterns have first, second, and third distances between holes in first, second, and third rows, respectively, determining a degree of distortion in each row, and calculating adjusted mask data by calibrating a size of the second and third hole patterns in accordance with the distance and the degree of distortion in each row for generating a photoresist hole pattern to be the same as the mask hole pattern.

15 Claims, 4 Drawing Sheets

$$A(2)=A(1)-L(2)*S(2)$$

$l-2S(1)$
 $l-S(1)$

A = ORIGINAL DATA $2P(1) > 2P(2)$ $L(1) = A * P(1) * -P(1)-A$ $$A(1) = A - L(1) * S(1)$$

$$L(2) = A(1) * \{P(2)+S(1)\} * -\{P(2)+S(1)\} - A(1)$$

$A(2) = A(1) - L(2) * S(2)$

METHOD OF GENERATING MASK DATA IN FABRICATING SEMICONDUCTOR DEVICES

This application claims the benefit of Korean Application No. 1802/1999 filed Jan. 21, 1999, which is hereby incorporated by reference.

BACKGROUND OF THE INVENTION

1. Field of the Invention

The present invention relates to a semiconductor device, and more particularly, to a method of generating mask data in fabricating semiconductor devices. Although the present invention is suitable for a wide scope of applications, it is particularly suitable for suppressing a proximity effect in mask fabrication.

2. Discussion of the Related Art

In a photolithographic process of the semiconductor fabrication, a photoresist is patterned by exposing the photoresist to light through a mask on a semiconductor substrate. The semiconductor substrate is then etched using the patterned photoresist. In order to form a contact hole or a via hole in the semiconductor substrate, it is imperative to pattern the photoresist without shifting hole locations and distorting a hole shape.

As a semiconductor device becomes highly integrated, a distance between contact holes and via holes becomes narrower, so that a distance between holes in a mask hole pattern is inevitably closer. Accordingly, as the distance between holes in a mask having a hole pattern becomes closer, a photoresist hole pattern distorted from the original mask hole pattern may be formed on the semiconductor substrate surface due to a proximity effect.

The proximity effect occurs when a photoresist is exposed to light, and a hole pattern on a semiconductor substrate tends to be larger than the original mask hole pattern. The light which has passed through the hole in a mask exists not only in a lower portion of the hole but also in a lower portion of the region other than the hole. This is due to its wave characteristic, wherein the light existing in lower portions of the hole as well as the region other than the hole develops a constructive interference. When an intensity of the constructively interferenced light is high enough to etch the photoresist, the photoresist is further etched an area around the original mask hole pattern, thereby deviating from the mask hole pattern. In this process, a distortion of the photoresist hole pattern from the mask hole pattern becomes larger as the distance between holes becomes closer.

FIGS. 1A through 1C are top views of hole patterns to illustrate a proximity effect. In each drawing, a mask hole pattern 1 is shown as a solid line while a photoresist hole pattern 2 formed on a semiconductor substrate is shown as a dotted line. Since a contact hole or a via hole is formed as a square column, the mask hole pattern 1 is formed as a square shape.

FIG. 1A shows an example for which a mask having a single hole assuming that a distance between holes is infinite, so that the photoresist is etched by only an intensity of the light passed through the hole. In other words, a constructive interference plays no role in this case. Therefore, the photoresist hole pattern 2 formed on the semiconductor substrate is the same as the mask hole pattern 1.

In FIG. 1B, however, the mask hole pattern 1 has neighboring holes having a distance therebetween, so that the photoresist hole pattern 2 formed on the semiconductor substrate is further etched by a distance d due to a proximity effect. As a result, the photoresist hole pattern 2 formed is rectangular instead of square and extends in a direction toward a neighboring hole direction.

FIG. 1C shows a distance between holes which is much narrower than that of FIG. 1B. The photoresist hole pattern 2 formed on the semiconductor substrate is shifted by a distance d', which is larger than d in terms of a shifted degree from the mask hole pattern 1. Thus, the holes 2 are connected to one another, as shown in FIG. 1C.

In order to prevent the proximity effect, a phase shift mask or an anti-reflective film has been employed in a background art. The phase shift mask has a controlled thickness and material in a light-shielding region to invert the phase of light in the light-shielding region of the phase shift mask. That is, the phase shift mask prevents a proximity effect by offsetting the light in a lower portion of the region other than the hole. However, since such a phase shift mask is expensive, it cannot be widely applied in the general process.

In another method of the background art, after an anti-reflective film is coated under the photoresist, the photoresist is patterned using a general mask. In this process, the anti-reflective film causes respective light on a lighting region and a shielding region to have opposite phases and to be offset with each other. Nonetheless, such a method still requires a coating process of the anti-reflective film.

SUMMARY OF THE INVENTION

Accordingly, the present invention is directed to a method of generating mask data in fabricating semiconductor devices that substantially obviates one or more of the problems due to limitations and disadvantages of the related art.

Another object of the present invention to provide a method of generating mask data in fabricating semiconductor devices, wherein mask data is generated in considering a distortion in advance, thereby eliminating a proximity effect, reducing production cost, and process steps.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of generating data for a mask in fabricating a semiconductor device, the method comprising the steps of determining original mask data for a mask hole pattern on the mask, the hole pattern being formed in at least three rows, defining the mask hole pattern as first, second, and third hole patterns, wherein the first, second, and third hole patterns have first, second, and third distances between holes in first, second, and third rows, respectively, determining a degree of distortion in each row, and calculating adjusted mask data by calibrating a size of the second and third hole patterns in accordance with the distance and the degree of distortion in each row for generating a photoresist hole pattern to be the same as the mask hole pattern.

In another aspect of the present invention, a method of generating mask data in fabricating a semiconductor device, the method comprising the steps of determining first mask data for a mask hole pattern on a mask, the mask hole pattern being formed in N rows, determining a first distance between the mask hole patterns in a first row, determining a second distance between the mask hole patterns in a second row, the first distance being greater than the second distance, determining an (N−1)th distance between the mask hole patterns in an (N−1)th row, determining an Nth distance between the mask hole patterns in an Nth row, the (N−1)th distance being greater than the Nth distance, determining a first degree of distortion in the second row, determining a second degree of distortion in the third row, the second degree of distortion being greater than the first degree of distortion, determining an (N−1)th degree of distortion in the (N−1)th row, determining an Nth degree of distortion in the Nth row, the Nth degree of distortion being greater than the (N−1)th degree of distortion, and compensating the first mask data in accordance with each distance and each degree of distortion, thereby determining each mask data in each row for producing first photoresist hole patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

For better understanding of the present invention, it may be necessary to understand the term "degree of distortion" with regard to a mask having predetermined sized holes. The degree of distortion refers to a magnitude that a photoresist hole pattern is distorted from a mask hole pattern due to a proximity effect. As discussed above, the narrower the distance between holes of a mask, the larger a degree of distortion.

Such a distortion is a value which can be measured with regard to a mask having holes having a predetermined size. In this measurement, distance between holes on the mask varies from a large value to a small value. When the distance is large, the proximity effect does not occur during the process. Conversely, when the distance is small, the proximity effect is so serious that the patterned holes are connected to each other. A hole size of the photoresist pattern formed on the semiconductor substrate is then measured after exposing to the light. At this time, the distance between the holes of the mask may be classified with different intervals. It is assumed that a degree of distortion is the same as each interval. The number of intervals is determined by a permitted error limit. The exact location of a hole deviates during a photolithographic process. The deviation is called a "margin." When the margin is large, the number of intervals may be less than that of a smaller margin. For example, in forming a photoresist hole pattern consisting of square contact hole having a side length 0.25 µm and a distance between holes of 0.23 µm, a degree of distortion varies with the distance between holes. When a distance between holes is 0.23~0.3 µm, a large distortion occurs. When the distance is 0.3~0.5 µm, a small distortion occurs. When the distance becomes 0.5 µm, no distortion occurs. Then, a photoresist hole pattern is determined with regard to the respective distances.

Next, mask data is generated to decrease a degree of distortion. FIGS. 2A to 2E are top views sequentially illustrating the steps of generating mask data.

Figure 1A:
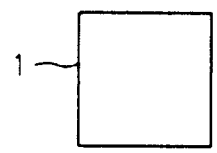
FIGS. 1A through 1C are top views of hole patterns according to a background art, wherein a solid line denotes a mask hole pattern and a dotted line denotes a photoresist hole pattern formed on a semiconductor substrate, respectively.
Figure 1A:
Figure 1B:
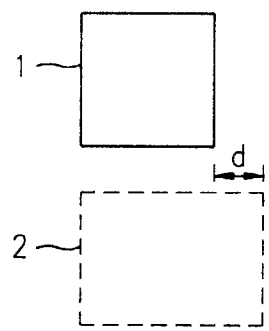
Figure 1B:
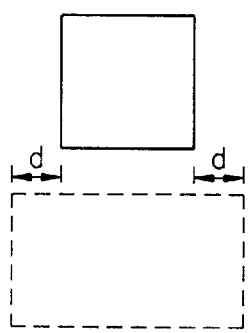
Figure 1B:
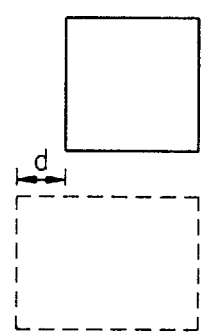
Figure 1C:
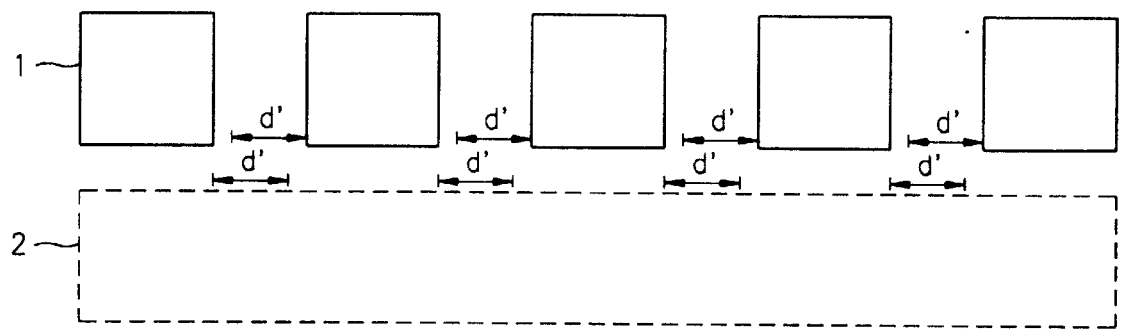
Figure 2A:
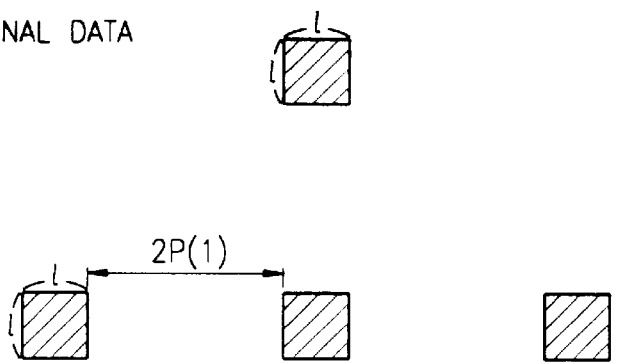
FIGS. 2A through 2E are top views of a mask, sequentially generated by using mask data according to the present invention.

Initially referring to FIG. 2A, an original data A plotted by a chip designer in accordance with a desired hole pattern on a semiconductor substrate is shown. The original data A consists of square holes having a side length 1. The top row has a single hole and it is assumed that a distance between holes in that row is infinite. A hole pattern having a distance between holes is 2p(1) in a subsequent row. At the bottom row, a hole pattern having a distance between holes is 2p(2). For convenience, it is assumed that the distances between the top row and the middle row and the bottom row are infinite. Thus, a proximity effect therebetween may be ignored.

As shown in FIG. 2A, generally, distances between holes formed in a mask have several different values. The values are determined in correspondence to the respective distances to obtain a degree of distortion as discussed above. For example, a mask having three different values will be explained with reference to FIGS. 2A–2E. The three values are as follows: a value having no proximity effect between holes; a value 2p(1) with a small proximity effect; and a value 2p(2) with a large proximity effect.

The original mask data is generated by an image process program using a computer. The data is generated by executing an operation, such as magnification, reduction, addition and substraction. For example, operators for executing the operation are defined as follows: the magnification is defined as an operator of *, the reduction is defined as an operator of *−, the addition is defined as an operator of +, and the subtraction is defined as operator of −. Using such operators, generation of the original data A according to the present invention will now explained in detail.

When a hole pattern having a large value 2p(1) among the distances between holes is considered, a data generation is implemented to decrease a degree of distortion which corresponds to 2p(1). The original data A is magnified as much as p(1), and then reduced by p(1). The value A is further subtracted therefrom. The obtained value L(1) is represented by Equation(1):

$$L(1) = A*p(1)*-p(1)-A \qquad (1)$$

Figure 2B:
Figure 2B:
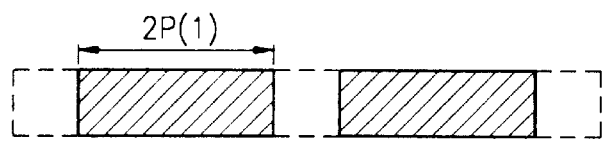
Figure 2B:
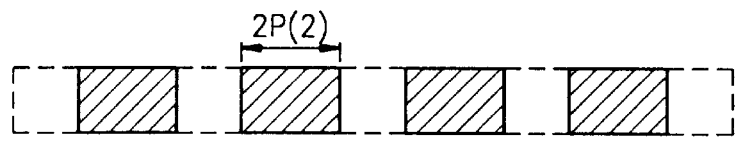

In FIG. 2B, L(1) is shown as a solid line. For convenience, the original data A is shown as a dotted line in FIG. 2B.

In the next step, a degree of distortion of holes having a distance between holes 2p(1) is obtained from the above-mentioned Equation(1). A degree of distortion is taken as s(1). Then, the L(1) is magnified by s(1). L(1) magnified by s(1) is then subtracted from the original data A. The obtained value A(1) is represented by Equation(2):

$$A(1)=A-L(1)*s(1) \quad (2)$$

Figure 2C:
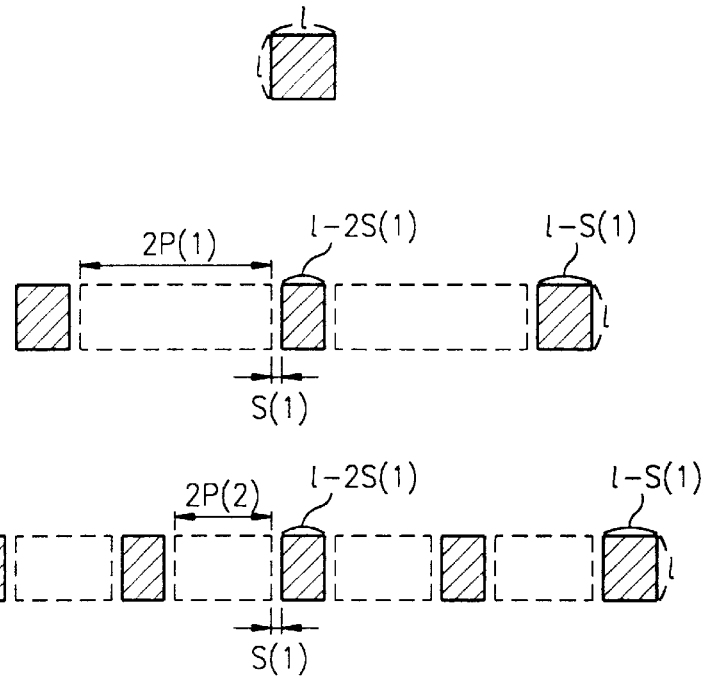

In FIG. 2C, A(1) is illustrated as a solid line and a dotted line represents L(1). A(1) is obtained by decreasing a size of the holes by s(1) toward the neighboring directions with respect to the holes having a distance between the holes less than 2p(1) in the original data A.

Therefore, in the holes at the bottom having a distance between holes of 2p(2), a size of the hole is decreased by s(1) toward the neighboring directions thereof However, since a degree of distortion of the holes having a distance between the holes 2p(2) is larger than s(1), an additional reduction is required.

As the same method of processing A to A(1) data, A(1) is magnified by p(2)+s(1), and then decreased by p(2)+s(1). Further, the value A(1) is subtracted therefrom. The result L(2) is represented by Equation (3):

$$L(2)=A(1)*\{p(2)+s(1)\}*-\{p(2)+s(1)\}-A(1) \quad (3)$$

Figure 2D:
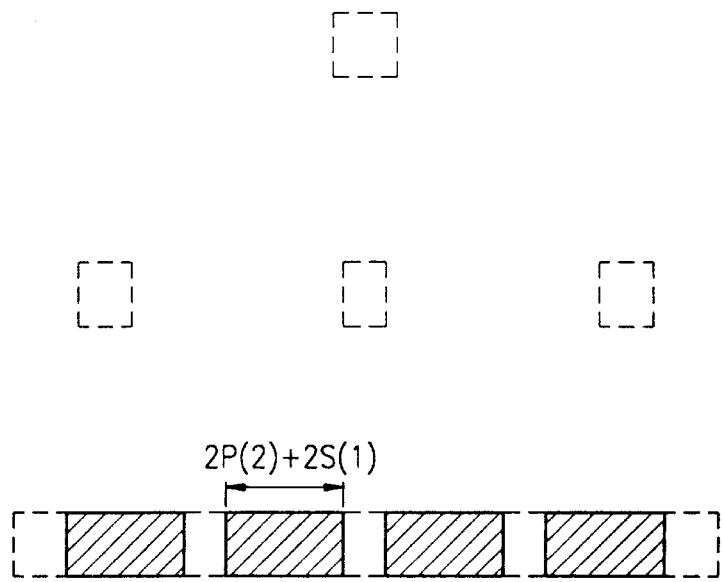

In FIG. 2D, L(2) is shown as a solid line and A(1) is shown as a dotted line. Here, a magnification or reduction ratio of A(1) is p(2)+s(1) because A(1) becomes the original data A by magnifying s(1) and adjacent holes having a distance between holes 2p(2) will be connected with each other by magnifying p(2). That is, the magnification or reduction ratio, p(2)+s(1), is a critical value which serves to connect holes having the distance between holes 2p(2) in the original data A.

From the above-described Equation(3), a degree of distortion t(2) of holes having a distance between holes 2p(2) is obtained. Due to a reduction as much as s(1) in the step of obtaining A(1) data, t(2)−s(1) is additionally decreased therefrom. Assuming that t(2)−s(1) is s(2), L(2) is magnified by s(2). Then, the L(2) magnified by s(2) is subtracted from A(1). The obtained value A(2) is represented by Equation (4):

$$A(2)=A(1)-L(2)*s(2) \quad (4)$$

Figure 2E:
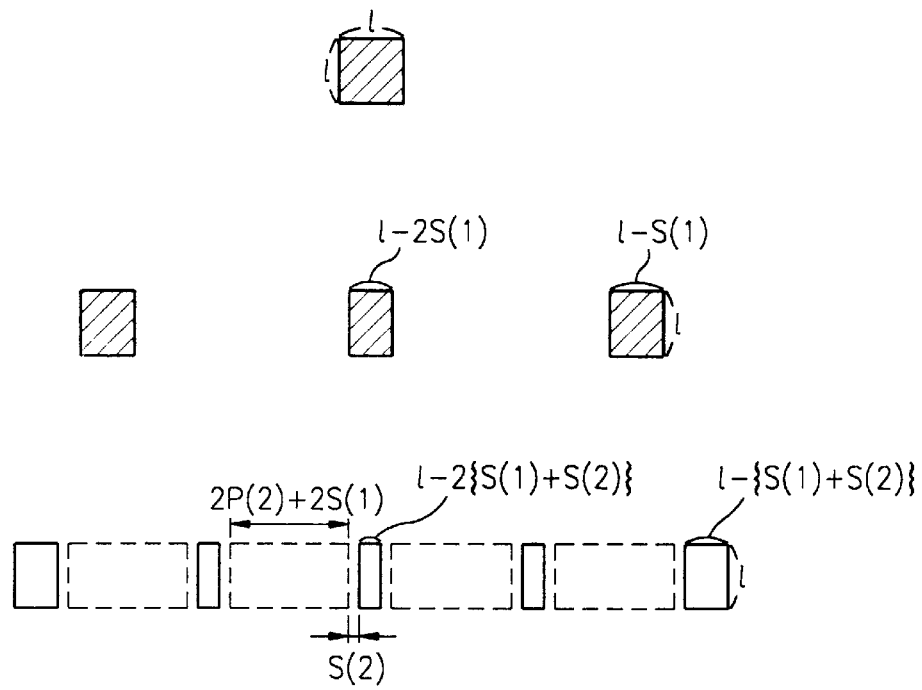

In FIG. 2E, A(2) is shown as a solid line and L(2) is shown as a dotted line. A(2) denotes the decrease in the hole size as much as s(2) toward the neighboring directions with regard to the holes having a distance between holes less than 2p(2)+2s(1) in A(1) data. Therefore, A(2) is obtained by decreasing the hole size as much as s(1)+s(2) toward the neighboring directions with regard to the holes having the distance between holes less than 2p(2) in the original data A.

Using above described method, the data generation with regard to mask having three different hole patterns for three intervals of the distance between holes is completed. Therefore, A(2) is determined as final mask data and used to fabricate a desired mask.

Figure 3:
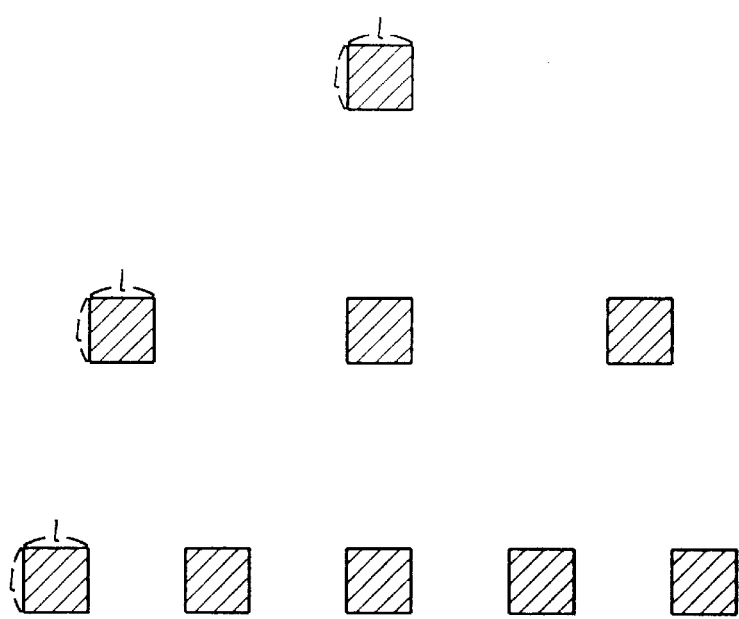
FIG. 3 is a top view of a patterned photoresist on the semiconductor substrate according to the present invention.

FIG. 3 is a top view of a photoresist patterned by exposing the photoresist formed on a semiconductor substrate to the light using a mask fabricated in accordance with the A(2) data, as shown in FIG. 2E. As shown therein, with regard to all three different hole patterns having different distances between holes, a desired square hole pattern with a side length 1 is obtained.

With reference to the above example of a mask having three different values, as shown in FIGS. 2A–2E, a method of generating mask data will now be explained.

In a mask consisting of hole patterns having predetermined size of holes, the distance between holes is represented by 2p(I), wherein I is sequentially numbered from 0 to N. The hole patterns are sorted according to 2p(I) while the number of sorted hole patterns is N+1. A hole having a distance between sorted holes 2p(0) (I=0) denotes an independent hole which is sufficiently distanced not to have a proximity effect. Although there is no independent hole among the holes formed in the mask, it may be assumed that there is an independent hole for simplicity.

The hole pattern of the mask is inputted as the original data A. The original data is generated by considering the hole pattern in an order where I varies from 1 to N.

A degree of distortion t(I) with regard to respective hole patterns divided in the number N+1 is represented by Equation(5):

$$t(I)=s(1)+s(2)+\ldots+s(I) \quad (5)$$

Therefore, using Equations (1) through (4) with regard to the distance between holes 2p(I), L(I), A(I) are represented by Equations (6) and (7), respectively.

$$L(I)=A(I-1)*\{p(I)+t(I-1)\}*-\{p(I)+t(I-1)\}-A(I-1) \quad (6)$$

$$A(I)=A(I-1)-L(I)*s(I) \quad (7)$$

Here, t(I−1) in Equation(6) corresponds to s(1)+s(2)+ ... +s(I−1) from Equation(5).

Using the Equations (6) and (7), with regard to a mask wherein the hole patterns divided in the number N+1 coexist in accordance with the distance between holes, A(I) is obtained in an order of I=1 to I=N. As a result, a mask data generation is completed by obtaining Equation (8) for A(N) as follows:

$$A(N)=A(N-1)-L(N)*s(N) \quad (8)$$

An example of exposure to a light source having the same size as that of the hole in the mask (i.e. a ratio of exposing to light is 1) has been described. This invention is also applicable to exposing to the light with different exposing conditions including a magnification or reduction of mask hole patterns.

As described above, in the method of generating mask data according to the present invention, a degree of distortion from a mask hole pattern is considered prior to mask fabrication, and is decreased. Thus, a high cost mask, such as a conventional phase shift mask, is not required in the present invention.

Further, since the data generation is implemented prior to the mask fabrication, the mask is fabricated according to the generated data for preventing a proximity effect. Thus, without employing additional processes, a process in the present invention is much simplified comparing to the process of using a conventional anti-reflective coating film.

It will be apparent to those skilled in the art that various modifications and variations can be made in the method of generating mask data in fabricating semiconductor devices of the present invention without departing from the spirit or scope of the inventions. Thus, it is intended that the present invention covers the modifications and variations of this invention provided they come within the scope of the appended claims and their equivalents.

What is claimed is:

1. A method of generating data for a mask in fabricating a semiconductor device, the method comprising the steps of:

determining original mask data for a mask hole pattern on the mask, the hole pattern being formed in at least three rows; defining the mask hole pattern as first, second, and third hole patterns, wherein the first, second, and third hole patterns have first, second, and third distances between holes in first, second, and third rows, respectively;

determining a degree of distortion in each row; and calculating adjusted mask data by calibrating a size of the second and third hole patterns in accordance with the distance and the degree of distortion in each row for generating a photoresist hole pattern to be the same as the mask hole pattern.

2. The method according to claim 1, wherein the third hole pattern causes the most proximity effect and the first hole pattern the least proximity effect during photolithography.

3. The method according to claim 1, wherein the third distance is the smallest and the first distance the greatest.

4. The method according to claim 1, wherein the degree of distortion includes a magnitude in difference between the photoresist hole pattern formed on a substrate and the mask hole pattern.

5. The method according to claim 4, wherein the degree of distortion varies with the distance between the holes.

6. The method according to claim 4, wherein the degree of distortion is assumed to be the same among the first, second, and third distances.

7. The method according to claim 1, wherein the step of defining the mask hole pattern is determined by a margin of an error limit deviating from the photoresist hole pattern.

8. The method according to claim 1, wherein the first, second, and third distances are represented by $2p(I)$ where $I$ varies with 0 for the first distance to N for an Nth distance.

9. The method according to claim 8, wherein the number of the mask hole patterns includes $N+1$.

10. The method according to claim 8, wherein $2p(0)$ denotes the holes sufficiently distanced from one another, so that no proximity effect occurs during photolithography.

11. The method according to claim 1, wherein the step of determining original mask data is executed by an image process program using a computer.

12. The method according to claim 11, wherein the image process program is executed by a combination of operations including magnification, reduction, addition and subtraction.

13. The method according to claim 12, wherein the magnification is defined as an operator of *, the reduction is defined as the operator of *−, the addition is defined as the operator of + and the subtraction is defined the operator of −.

14. The method according to claim 1, wherein the step of calculating adjusted mask data is executed by using an equation, $A(N)=A(N-1)-L(N)*s(N)$, wherein $A(N)$ is an Nth adjusted mask data, $A(N-1)$ is an $(N-1)$th adjusted mask data, $L(N)=A(N-1)*\{p(N)+t(N-1)\}*-\{p(N)+t(N-1)\}-A(N-1)$, $s(N)=t(N)-s(1)-s(2)\ldots$, $p(N)$ is an half distance between the holes, $t(N)$ is the degree of distortion, and * is defined as an operator of a magnification, *− is defined as the operator of a reduction, + is defined as the operator of an addition and − is defined as the operator of a subtraction.

15. A method of generating mask data in fabricating a semiconductor device, the method comprising the steps of:

determining first mask data for a mask hole pattern on a mask, the mask hole pattern being formed in N rows;

determining a first distance between the mask hole patterns in a first row;

determining a second distance between the mask hole patterns in a second row, the first distance being greater than the second distance;

determining an $(N-1)$th distance between the mask hole patterns in an $(N-1)$th row;

determining an Nth distance between the mask hole patterns in an Nth row, the $(N-1)$th distance being greater than the Nth distance;

determining a first degree of distortion in the second row;

determining a second degree of distortion in the third row, the second degree of distortion being greater than the first degree of distortion;

determining an $(N-1)$th degree of distortion in the $(N-1)$th row;

determining an Nth degree of distortion in the Nth row, the Nth degree of distortion being greater than the $(N-1)$th degree of distortion; and compensating the first mask data in accordance with each distance and each degree of distortion, thereby determining each mask data in each row for producing photoresist hole patterns.

* * * * *